March 27, 1962 K. HINRICHS 3,027,520

SWITCHING CIRCUIT

Filed Nov. 3, 1958

INVENTOR.
KARL HINRICHS

BY HIS ATTORNEYS.
HARRIS, KIECH, FOSTER & HARRIS

United States Patent Office 3,027,520

Patented Mar. 27, 1962

3,027,520

SWITCHING CIRCUIT

Karl Hinrichs, Anaheim, Calif., assignor to Beckman Instruments, Inc., a California corporation Filed Nov. 3, 1958, Ser. No. 771,512
3 Claims. (Cl. 330—147)

This invention relates to switching circuits and, in particular, to circuits using make-before-break type switches such as mercury relays.

Mercury relays are well known and are used extensively, particularly in applications where high reliability and long operating life are required. However, they have certain disadvantages which can be eliminated in dry contact relays and different types of switching circuits are often required with mercury relays. In particular, the mercury relays have relatively high coil-contact capacitance which introduces undesired noise voltages in low signal level circuits. Also, mercury relays are of the make-before-break type only, since the moving contact creates a pool of mercury between the two fixed contacts during the switching operation thereby providing a short circuit between the three contacts for a brief period during each switching cycle.

Accordingly, it is an object of the invention to provide switching circuits using make-before-break type switches which substantially eliminate the adverse effects due to high coil-contact capacitance and common pool or short-circuiting during switching.

It is an object of the invention to provide a switching circuit using make-before-break switches for selecting and connecting one or more input voltages to an output terminal while maintaining isolation between the various input voltages. A further object is to provide a switching circuit using make-before-break switches for connecting and disconnecting one or more signal voltages at a summing point, while preventing floating circuits at the summing point and without overloading the signal voltage inputs. A further object is to provide a switching circuit using make-before-break switches for switching an output from one input to another while maintaining isolation between the various inputs.

It is an object of the invention to provide a switching circuit using make-before-break switches for switching between summing resistors connected to a summing point while eliminating adverse capacitance effects of the switches and avoiding shunting or grounding of signal sources without disturbing the arithmetic relationship of the summing resistors.

It is a further object of the invention to provide switching circuits such as referred to above for use in combination with high gain amplifiers to provide operational type feedback amplifiers with the switching circuits permitting addition of selected combinations of input voltages to the amplifiers. It is a further object of the invention to provide a method of actuating make-before-break switches which are connected to a plurality of input voltages in order to connect any one of the input voltages to an output terminal while maintaining isolation between the various input voltages.

Other objects, advantages, features and results of the invention will more fully appear in the course of the following description. The drawing merely shows and the description merely describes preferred embodiments of the present invention which are given by way of illustration or example.

Figure 1:
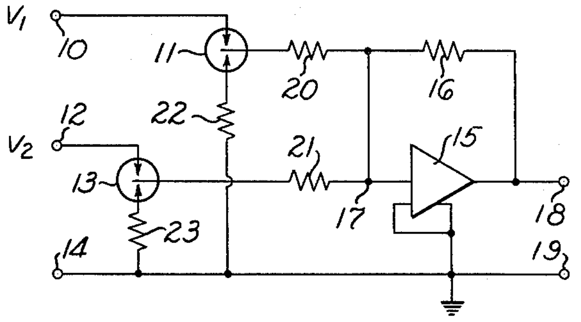
FIG. 1 is a schematic diagram of a preferred embodiment of the invention.

FIG. 1 shows a circuit especially adapted for connecting one or more input signal voltages as inputs to an amplifier or the like. In the circuit of FIG. 1, only two input voltages $V_1$, $V_2$ are shown, although, of course, it is realized that any number of input voltages could be handled by the switching circuit of the invention. The voltage $V_1$ is applied at an input terminal 10 which is connected to a fixed contact of a mercury switch 11. The voltage $V_2$ is applied at an input terminal 12 which is similarly connected to a fixed contact of a mercury switch 13. The ground returns for the input voltages are connected to circuit ground at a terminal 14. An amplifier 15 has a feedback resistor 16 connected between its input and output so as to function as an operational type feedback amplifier with junction 17 serving as the summing point or node for the feedback signal and output signal from the switching circuit, and with the amplifier output appearing at terminals 18, 19. An input resistor 20 is connected between the moving contact of the switch 11 and the summing node and an input resistor 21 is connected between the moving contact of the switch 13 and the summing node. A grounding resistor 22 is connected between the other fixed contact of the switch 11 and circuit ground and a grounding resistor 23 is connected between the other fixed contact of the switch 13 and circuit ground.

This switching circuit provides two very important features. First, the summing node terminals of the input resistors 20, 21 are permanently connected to the summing node 17 with the connecting of these resistors to the input terminals being done at the resistor terminals remote from the summing node. Second, each input resistor is connected to ground through an associated grounding resistor when not connected to an input voltage. Noise voltages due to the large coil-contact capacitance of the mercury switch will be introduced into the circuit at the moving contact of the switch which is remote from the summing node. These noise voltages are then bypassed to ground either through the input voltage source or through the grounding resistor rather than being introduced into the amplifier at the summing node, which is the point of the circuit most sensitive to noise.

The switching circuit of FIG. 1 can be used to add the input voltages $V_1$ and $V_2$ by connecting both through their corresponding switches and input resistors to the summing node or the circuit can be used to connect either of the input voltages alone to the summing node or neither voltage may be connected. In similar switching circuits where more than two input voltages are being switched, any combination of zero or more of the voltages can be connected to the summing node. In this circuit, any input resistor having no input voltage thereto is switched to ground through the associated grounding resistor. When so grounded, the contribution to the voltage at the summing node due to the grounded input resistor is zero and the arithmetic relationship of the various input resistors is not disturbed by the grounding connection. At the same time, this grounding connection prevents floating of the input resistor and substantially eliminates undesired noise voltage pickup due to capacitance of the relays and the like. The impedance of a grounding resistor should be quite small relative to the impedance of the associated input resistor. The impedance of the grounding resistor should not be more than about one-tenth that of the input resistor and preferably about one-hundredth.

When one of the switches of the circuit of FIG. 1 is being actuated, the input voltage connected thereto is connected to ground through the common pool of mercury within the switch. However, the grounding resistor connected between the switch and circuit ground prevents shorting of the input voltage to ground and prevents any high current load on the input voltage source. Hence, the grounding resistor coupled to the make-before-break switch, as shown in the circuit of FIG. 1, serves to prevent undesired pickup on the unconnected input resistor and also prevents damage to the input voltage source due to the common pool in the make-before-break switch.

Figure 2:
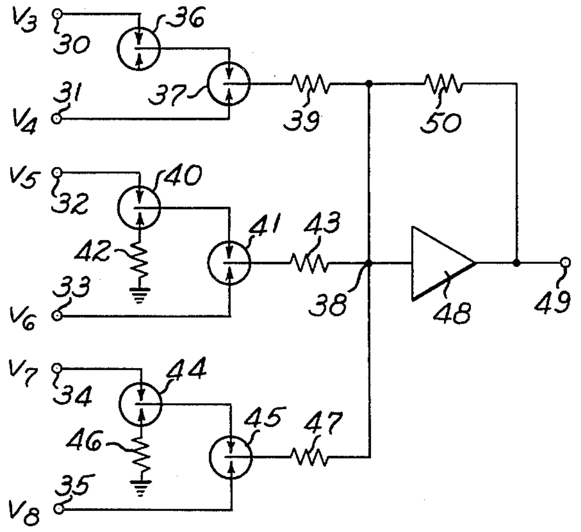
FIG. 2 is a schematic diagram of an alternative embodiment of the invention.

FIG. 2 shows an alternative embodiment of the invention in which one or more of a plurality of input voltages may be coupled to a common point to serve as an input for an amplifier or any other purpose. The input voltages $V_3$—$V_8$ are coupled to input terminals 30—35 respectively. The input terminal 30 is connected to a fixed contact of a mercury switch 36 and the moving contact of this switch is connected to a fixed contact of another mercury switch 37. The input terminal 31 is connected to the other fixed contact of the switch 37 and the moving contact of this switch is connected to a summing node 38 through an input resistor 39. The input terminal 32 is connected to a fixed contact of a mercury switch 40 and the moving contact of the switch is connected to the fixed contact of another mercury switch 41. A grounding resistor 42 is connected between the other fixed contact of the switch 40 and circuit ground. The input terminal 33 is connected to the other fixed contact of the switch 41 and the moving contact of this switch is connected to the summing node by an input resistor 43. The input terminal 34 is connected to a fixed contact of a mercury switch 44 and the moving contact of the switch is connected to a fixed contact of another mercury switch 45. A grounding resistor 46 is connected between the other fixed contact of the switch 44 and circuit ground. The input terminal 35 is connected to the other fixed contact of the switch 45 and the moving contact of this switch is connected to the summing node through an input resistor 47. An amplifier 48 is connected between the summing node 38 and an output terminal 49 with a feedback resistor 50 connected therebetween to provide a conventional operational type feedback amplifier.

The switching circuit of FIG. 2 permits connection of the input signal $V_3$ or $V_4$ either alone or in combination with the input signal $V_5$ or $V_6$ and/or the input signal $V_7$ or $V_8$ to the summing node 38, while substantially eliminating adverse effects of coil-contact capacitance, preventing floating input resistors and high current loads on the signal sources, and maintaining isolation between the sources.

First consider the operation of the circuit of FIG. 2 with only the voltages $V_3$ and $V_4$ and the switches 36 and 37. Either of the input terminals 30, 31 could be connected to the summing node 38 by means of a conventional single-pole double-throw break-before-make relay. However, where a mercury switch having make-before-break characteristics is utilized, the two input terminals would be shorted together during the switching operation, which short may place a high current load on one of the sources and otherwise be undesirable. To overcome this disadvantage, the switching circuit of the invention uses two mercury switches connected in cascade. First assume that the moving contacts of the switches 36 and 37 are both in the upper position as shown in FIG. 2 with the terminal 30 connected to the summing node 38 through the input resistor 39. In order to disconnect the terminal 30 and connect the terminal 31, the switches are operated in the following sequence. First, the switch 36 is actuated to disconnect the terminal 30 from the fixed contact of the switch 37. It should be noted that while a double-throw switch is shown for the switch 36, a simple off-on mercury switch could be utilized. Then the switch 37 is actuated to shift the moving contact to the lower fixed contact and connect the terminal 31 to the intput resistor. During this switching operation there will be a short circuit between the two fixed contacts of the switch 37. However, the upper fixed contact is floating and no harm can result from this short circuit. The voltage $V_3$ is selected in place of the voltage $V_4$ by operating the switches in the reverse sequence, i.e., switch 37 is first actuated to disconnect the terminal 31 from the summing node and connect the moving contact of the switch 37 to the switch 36. Then the switch 36 is actuated to connect the input terminal 30 to the summing node through the switch 37.

The switches 40 and 41 are connected in cascade and are operated in the same manner as the switches 36 and 37 to connect either of the signals $V_5$, $V_6$ to the summing node. The grounding resistor 42 provides in addition for connecting neither of the signals $V_5$, $V_6$ to the summing node. Suppose both switches 40 and 41 are in the upper position with the terminal 32 connected to the summing node. First, the switch 40 is actuated to connect the moving contact thereof to circuit ground through the grounding resistor 42. Then both input terminals 32 and 33 are open and the input resistor 43 is connected to ground through the resistor 42 in the same manner as in the embodiment of FIG. 1. A floating input is prevented while not disturbing the arithmetic relationships of the input resistors of the circuit. If it is then desired to connect the input terminal 32, the switch 40 is actuated. However, if it is desired to connect the input terminal 33, the switch 41 is actuated to connect the signal $V_6$ to the summing node. During operation of the switch 41, the voltage $V_6$ will be coupled across the fixed contacts of the switch to ground through the resistor 42. However, as in the embodiment of FIG. 1, the grounding resistor prevents a high current load on the voltage source. In order to switch from the voltage $V_6$ to the voltage $V_5$, the switch 41 is first actuated to disconnect the terminal 33 and then the switch 40 is actuated to connect the terminal 32. The interval between operation of the two switches must be longer than the duration of the common pool within a switch during its operation. The common pool duration is usaully in the order of a few milliseconds and, hence, the time delay between actuation of the cascaded switches can be quite small.

The input terminals 35 and 36 are switched in the same manner as the terminals 32 and 33. Either of the voltages $V_7$, $V_8$ can be selected in place of the voltages $V_5$, $V_6$ or either can be selected in combination with one of the voltages $V_5$, $V_6$. Other desired combinations of input voltages can be achieved by selection of suitable combinations of input terminals and switches as shown in the circuit of FIG. 2.

Figure 3:
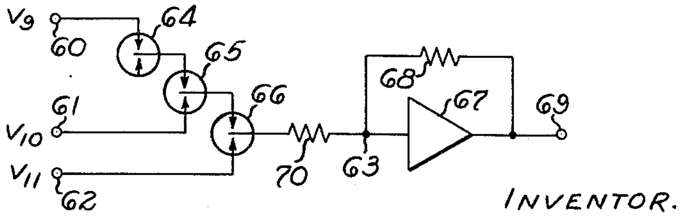
FIG. 3 is a schematic diagram of another alternative embodiment of the invention.

FIG. 3 shows a switching circuit wherein any one of a plurality of input voltages $V_9$, $V_{10}$, $V_{11}$ appearing at input terminals 60, 61, 62, respectively, may be connected to a summing node 63 by cascade connected mercury switches 64, 65, 66 while maintaining electrical isolation between the voltage sources. The summing node 63 serves as an input to an amplifier 67 having a feedback resistor 68 connected between the summing node and an output terminal 69. The input terminal 60 is connected to a fixed contact of the switch 64 and a moving contact thereof is connected to a fixed contact of the switch 65. The terminal 61 is connected to the other fixed contact of the switch 65 and the moving contact thereof is connected to a fixed contact of the switch 66. The input terminal 62 is connected to the other fixed contact of the switch 66 and the moving contact thereof is connected to the summing node through an input resistor 70.

The sequence of operating the switches of the circuit of FIG. 3 is similar to that for the switches 36, 37 of the circuit of FIG. 2. The switch to which the selected input terminal is directly connected is first actuated to disconnect this input terminal from the moving contact of the switch. Then the switch to which the next selected input terminal is directly connected is actuated to connect the next selected input terminal to the moving contact of the switch, which moving contact is either directly or through the other previously actuated switches connected to the summing node. For example, consider that all three switches are in the upper position with the terminal 60 connected to the summing node. First the switch 64 is actuated to disconnect the terminal 60 from the moving contact thereof. Then in order to connect the terminal 62, the switch 66 is actuated. While there will be a short-circuit between the fixed contacts of each switch during operation thereof, short circuits between the input terminals will be prevented by following this sequence of switch actuation.

Another input voltage such as the voltage $V_{10}$ may be selected by first actuating the switch 66 to disconnect terminal 62 and then actuating the switch 65 to connect the terminal 61. Of course, any number of input voltages may be selected by providing a corresponding number of switches in cascade and operating the switches in the sequence outlined above.

Although exemplary embodiments of the invention have been disclosed and discussed, it will be understood that other applications of the invention are possible and that the embodiments disclosed may be subjected to various changes, modifications and substitutions without necessarily departing from the spirit of the invention.

I claim as my invention:

1. In an operational type feedback amplifier circuit including an amplifier having feedback means connected between its input and output and a plurality of input resistors, each having one end connected to the amplifier input which serves as a summing node, the combination of: a corresponding plurality of mercury switches, each having first and second fixed contacts and a moving contact; circuit means for connecting the moving contact of each switch to the other end of the corresponding input resistor; circuit means for connecting the first fixed contact of each switch to a corresponding input voltage source; and means including only a passive grounding resistor connected between ground and the second fixed contact of each switch, said resistor having a value which is small relative to the value of the associated input resistor.

2. In a circuit for connecting a selected one of a pair of input voltage sources to an operational type feedback amplifier which includes an amplifier having feedback means connected between its input and output and an input resistor having one end connected to the amplifier input which serves as a summing node, the combination of: a first mercury switch having first and second fixed contacts and a moving contact; a second mercury switch having first and second fixed contacts and a moving contact; circuit means for connecting the moving contact of said first switch to the other end of the input resistor; circuit means for connecting the moving contact of said second switch to the first fixed contact of said first switch; circuit means for connecting the second fixed contact of said first switch to one of said input voltage sources; circuit means for connecting the first fixed contact of said second switch to the other input voltage source; and passive resistive means not including a signal source for connecting the second fixed contact of said second switch to ground, said resistor means having a value which is small relative to the value of said input resistor.

3. In a signal switching circuit using make-before-break type switches, the combination of: first and second input terminals; a circuit ground terminal; an output terminal; first and second single-pole, double-throw mercury switches of the make-before-break type, with said first input terminal connected to one fixed contact of said first switch and said second input terminal connected to one fixed contact of said second switch; first and second coupling resistors, with one terminal of each connected to said output terminal and with the other terminal of said first coupling resistor connected to the moving contact of said first switch and the other terminal of said second coupling resistor connected to the moving contact of said second switch; and first and second grounding resistors, with one terminal of each connected to said circuit ground terminal and with the other terminal of said first grounding resistor connected to the other fixed contact of said first switch and the other terminal of said second grounding resistor connected to the other fixed contact of said second switch, and with the impedance of each of said grounding resistors smaller by a factor of ten than the impedance of the associated coupling resistor.

References Cited in the file of this patent

UNITED STATES PATENTS

| | | |
|---|---|---|
| 2,401,779 | Swartzel | June 11, 1946 |
| 2,489,008 | Callender | Nov. 22, 1949 |
| 2,706,265 | Buehler | Apr. 12, 1955 |
| 2,757,283 | Ingerson et al. | July 31, 1956 |
| 2,843,747 | Ashley | July 15, 1958 |
| 2,864,008 | Moore | Dec. 9, 1958 |
| 2,919,409 | Williams | Dec. 29, 1959 |